United States Patent
Seo et al.

(10) Patent No.: US 7,687,984 B2
(45) Date of Patent: Mar. 30, 2010

(54) ORGANIC LIGHT EMITTING DISPLAY DEVICE AND METHOD FOR FABRICATING THE SAME

(75) Inventors: Chang-Su Seo, Suwon-si (KR); Tae-Wook Kang, Seongnam-si (KR); Moon-Hee Park, Gyeonggi-do (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1358 days.

(21) Appl. No.: 11/126,341

(22) Filed: May 11, 2005

(65) Prior Publication Data

US 2005/0264183 A1    Dec. 1, 2005

(30) Foreign Application Priority Data

May 28, 2004    (KR)    ............... 10-2004-0038535

(51) Int. Cl.
*H05B 33/04* (2006.01)
*H05B 33/10* (2006.01)

(52) U.S. Cl. .................. 313/504; 313/506
(58) Field of Classification Search ......... 313/504–506; 428/690
See application file for complete search history.

(56) References Cited

U.S. PATENT DOCUMENTS 6,833,560 B2 * 12/2004 Konuma et al. ............... 257/72
2003/0234608 A1 * 12/2003 Lee et al. ..................... 313/504

FOREIGN PATENT DOCUMENTS

| JP | 2002-324662 | 11/2002 |
| JP | 2004-031324 | 1/2004 |
| JP | 2004-086014 | 3/2004 |
| KR | 10-2003-0094656 | 12/2003 |

* cited by examiner

*Primary Examiner*—Nimeshkumar D Patel
*Assistant Examiner*—Anne M Hines
(74) *Attorney, Agent, or Firm*—H.C. Park & Associates, PLC

(57) ABSTRACT

An organic light emitting display device including a thin film transistor in first and second regions on a transparent insulating substrate, a lower anode coupled to the thin film transistor, a reflective layer pattern formed on the lower anode in the first region, an upper anode formed on the reflective layer pattern in the first region and on the lower anode in the second region, and an organic layer formed on the upper anode in the first and second regions.

16 Claims, 5 Drawing Sheets

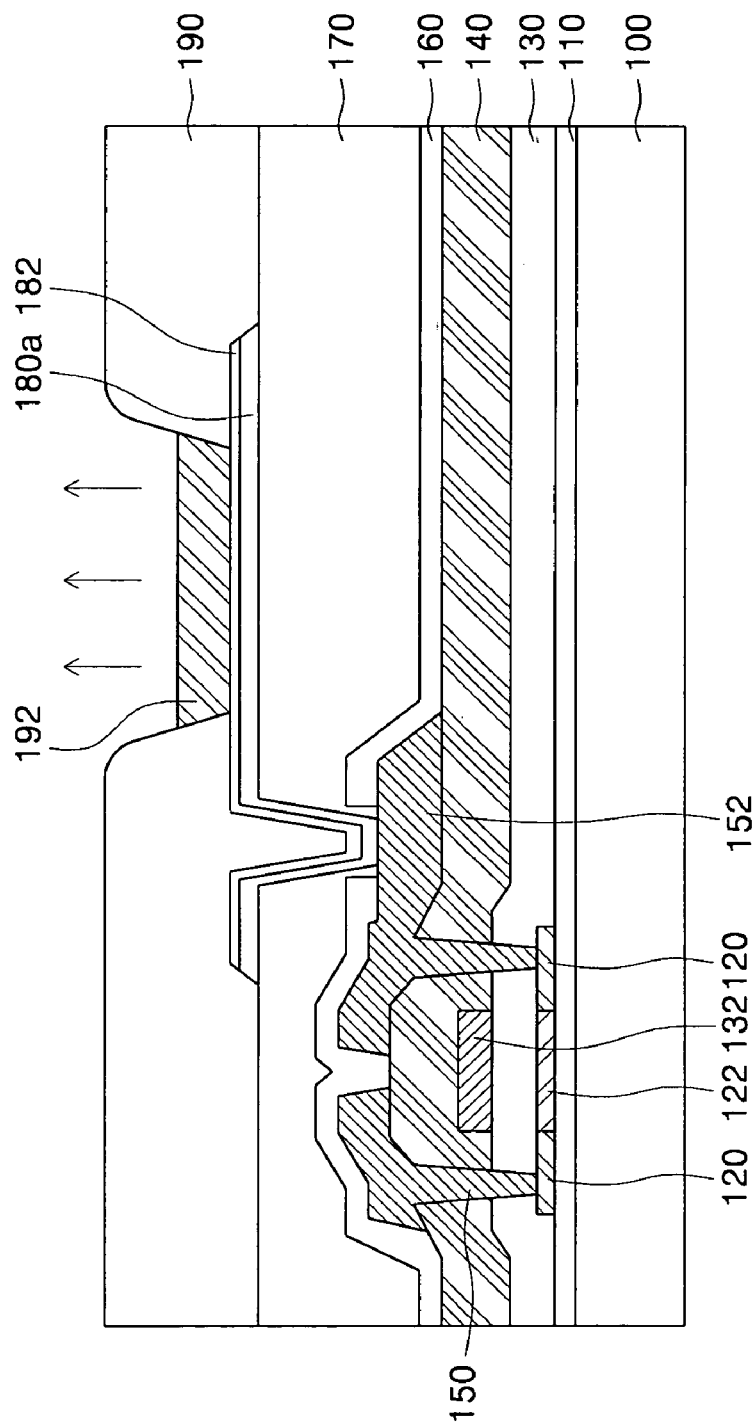

ORGANIC LIGHT EMITTING DISPLAY DEVICE AND METHOD FOR FABRICATING THE SAME

CROSS-REFERENCE TO RELATED APPLICATION

This application claims priority to and the benefit of Korean Patent Application No. 10-2004-0038535, filed May 28, 2004, which is hereby incorporated by reference for all purposes as if fully set forth herein.

BACKGROUND OF THE INVENTION

1. Field of the Invention

The present invention relates to an organic light emitting display (OLED) device and method for fabricating the same and, more particularly, to an OLED device having anode layers with a reflective layer interposed therebetween and method for fabricating the same.

2. Discussion of the Background

Generally, an OLED device is an emissive display device that emits light by electrically exciting fluorescent organic compounds. An OLED device may be considered a passive matrix OLED (PMOLED) device or an active matrix OLED (AMOLED) device depending on a manner of driving N×M pixels, which may be arranged in a matrix. The AMOLED device is suitable for large displays because of its low power consumption and high resolution, as compared to the PMOLED device.

Depending on a direction which light emits from the organic compound, an OLED device may be a top-emitting OLED device, a bottom-emitting OLED device, or a top and bottom-emitting OLED device. The top-emitting OLED device emits light in an opposite direction of a substrate with the pixels positioned thereon and it may have a high aperture ratio, unlike the bottom-emitting OLED.

Demand is increasing for an OLED device comprising both a top-emitting type, for a primary display window, and a bottom-emitting type, for a secondary display window, because the device may be miniaturized and it may consume little power. Such an OLED device may be primarily used for a portable telephone including the secondary display window outside and the primary display window therein. The secondary display window consumes less power than the primary display window, and it may remain on when the portable telephone is in a call waiting state, thus allowing a reception state, battery remaining amount, time, and the like to be observed at any time.

FIG. 1A is a cross-sectional view showing a conventional OLED device.

First, a buffer layer 110 is formed to a predetermined thickness on a transparent insulating substrate 100, and a thin film transistor, which includes a polycrystalline silicon pattern 122, a gate electrode 132, and source and drain electrodes 150 and 152, is formed on the substrate. Source and drain regions 120, having implanted impurities, are formed at both sides of the polycrystalline silicon pattern 122. A gate insulating layer 130 is formed on the entire surface of the substrate including the polycrystalline silicon pattern 122. The source and drain electrodes 150 and 152 are formed on an interlayer insulating layer 140, and they are connected to the source and drain regions 120 through contact holes.

A passivation layer 160 is then formed to a predetermined thickness on the entire surface and etched by photolithography and etching processes to form a first via contact hole (not shown) exposing either the source or drain electrode 150 or 152. FIG. 1A shows the exposed drain electrode 152. The passivation layer 160 is an inorganic insulating layer, which may comprise a silicon nitride layer, a silicon oxide layer, or a stacked structure thereof.

Next, a first insulating layer 170 is formed on the entire surface of the substrate. It may be formed of one material selected from a group consisting of polyimide, benzocyclobutene series resin, spin on glass (SOG), and acrylate. The first insulating layer 170 is formed to planarize a pixel region.

The first insulating layer 170 is subsequently etched by photolithography and etching processes to form a second via contact hole (not shown) exposing the first via contact hole.

Next, a stacked structure of a reflective layer (not shown) and a thin layer (not shown) for an anode is formed on the entire surface. The reflective layer may be formed of a metal having high reflectivity, such as aluminum (Al), molybdenum (Mo), titanium (Ti), gold (Au), silver (Ag), palladium (Pd), an alloy of these metals, or the like. Forming the reflective layer described above provides a top-emitting OLED device. On the other hand, forming the reflective layer in a subsequent process provides a bottom-emitting OLED device.

The thin layer for the anode is formed about 10 to 300 Å thick using a transparent metal material, such as Indium Tin Oxide (ITO).

The stacked structure is subsequently etched by photolithography and etching processes to form an anode 182 and a reflective layer pattern 180a.

A second insulating layer pattern 190 defining a emission region may then be formed on the entire surface of the substrate. The second insulating layer pattern 190 may be formed of one material selected from the group consisting of polyimide, benzocyclobutene series resin, phenol resin, and acrylate.

Subsequently, an emission layer 192 is formed in the emission region defined by the second insulating layer pattern 190, using a small molecule deposition method or a laser induced thermal imaging method. A cathode (not shown) and the like are then formed to thereby complete the OLED device. When forming a top-emitting OLED device, the cathode is formed of a transparent electrode or a transparent metal electrode, and when forming a bottom-emitting OLED device, the cathode is formed of a metal electrode having a reflective layer, or a reflective electrode.

If the reflective layer pattern and the anode in the top-emitting OLED device are formed in the stacked structure as described above, they may be simultaneously exposed to an electrolyte solution that is used in the photolithography and etching processes, which may damage the anode. Such damage may degrade the device's optical properties, such as brightness.

FIG. 1B is a cross-sectional view showing another conventional OLED device. The OLED device of FIG. 1B may form a reflective layer pattern 180b in an island structure to solve the above problem. This may prevent the reflective layer pattern 180b and the anode 182 from being simultaneously exposed to the electrolyte solution.

Since the top-emitting OLED device uses a resonance effect of light as described above, forming the anode as thin as possible facilitates color-coordinates adjustment. However, forming the thin anode may cause a short circuit at a step of the via contact hole. Further, when fabricating the OLED device including both the top-emitting OLED device and the bottom-emitting OLED device, using equally thick anodes for the top and bottom-emitting OLED devices may degrade the device's optical properties due to an increase in resistance.

SUMMARY OF THE INVENTION

The present invention provides an OLED device, and method for fabricating the same, having improved reliability by including a first region having a stacked structure of a lower anode, a reflective layer pattern with silver, and an upper anode, and a second region having a stacked structure of a lower anode and an upper anode.

Additional features of the invention will be set forth in the description which follows, and in part will be apparent from the description, or may be learned by practice of the invention.

The present invention discloses an OLED device including a thin film transistor in first and second regions on a transparent substrate, and a lower anode coupled to either a source or drain electrode of the thin film transistor in the first and second regions. A reflective layer pattern is formed on the lower anode in the first region, and an upper anode is formed on the reflective layer pattern in the first region and on the lower anode in the second region. An organic layer is formed on the upper anode in the first and second regions.

The present invention also discloses a method of fabricating an OLED device including forming a thin film transistor in a first region and a second region on a transparent substrate, forming a lower anode coupled to either a source or drain electrode of the thin film transistor in the first and second regions. A reflective layer pattern is formed on the lower anode in the first region, and an upper anode is formed on the reflective layer pattern in the first region and on the lower anode in the second region. An organic layer, having at least an emission layer, is formed on the upper anode in the first and second regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 1A is a cross-sectional view showing a conventional OLED device.

DETAILED DESCRIPTION OF THE ILLUSTRATED EMBODIMENTS

Hereinafter, exemplary embodiments of the present invention will be described with reference to the accompanying drawings.

Figure 1B:
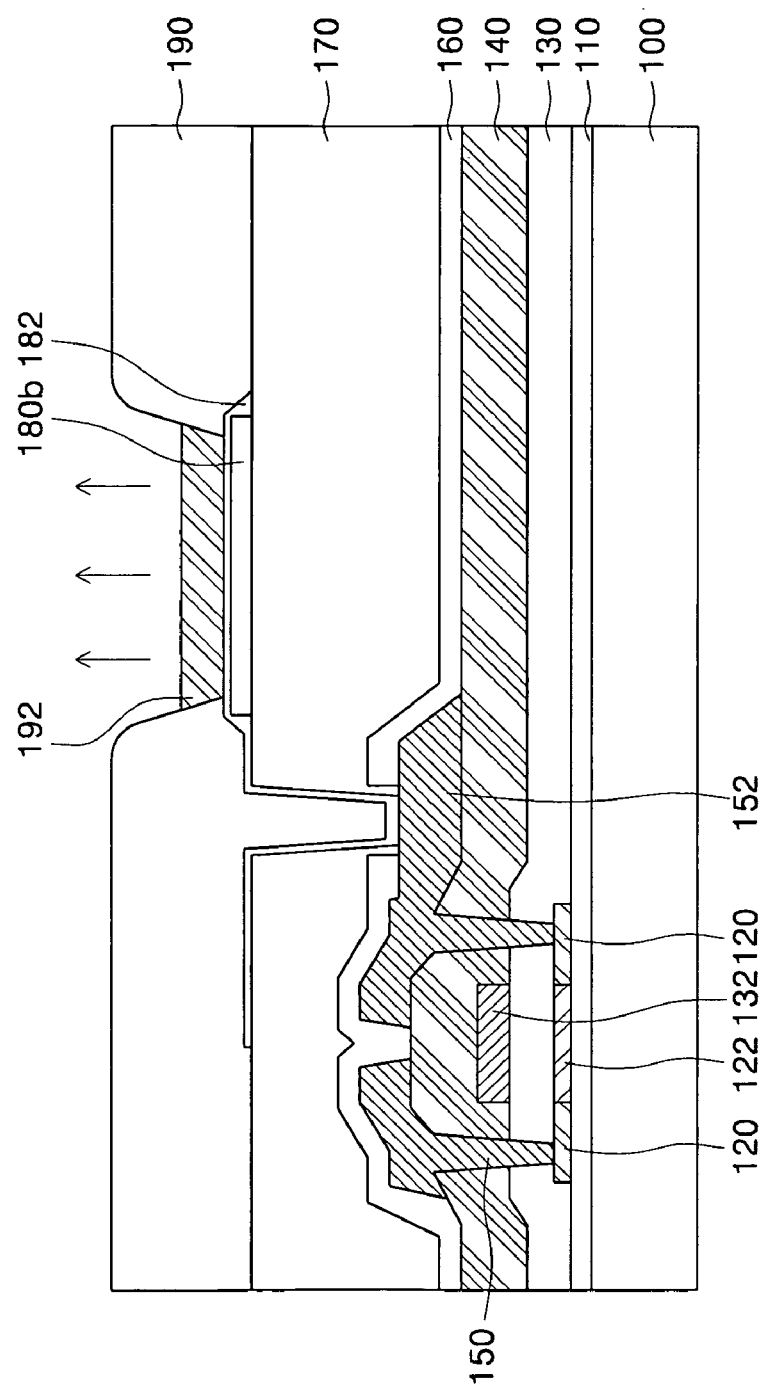
FIG. 1B is a cross-sectional view showing a conventional OLED device.
Figure 2A:
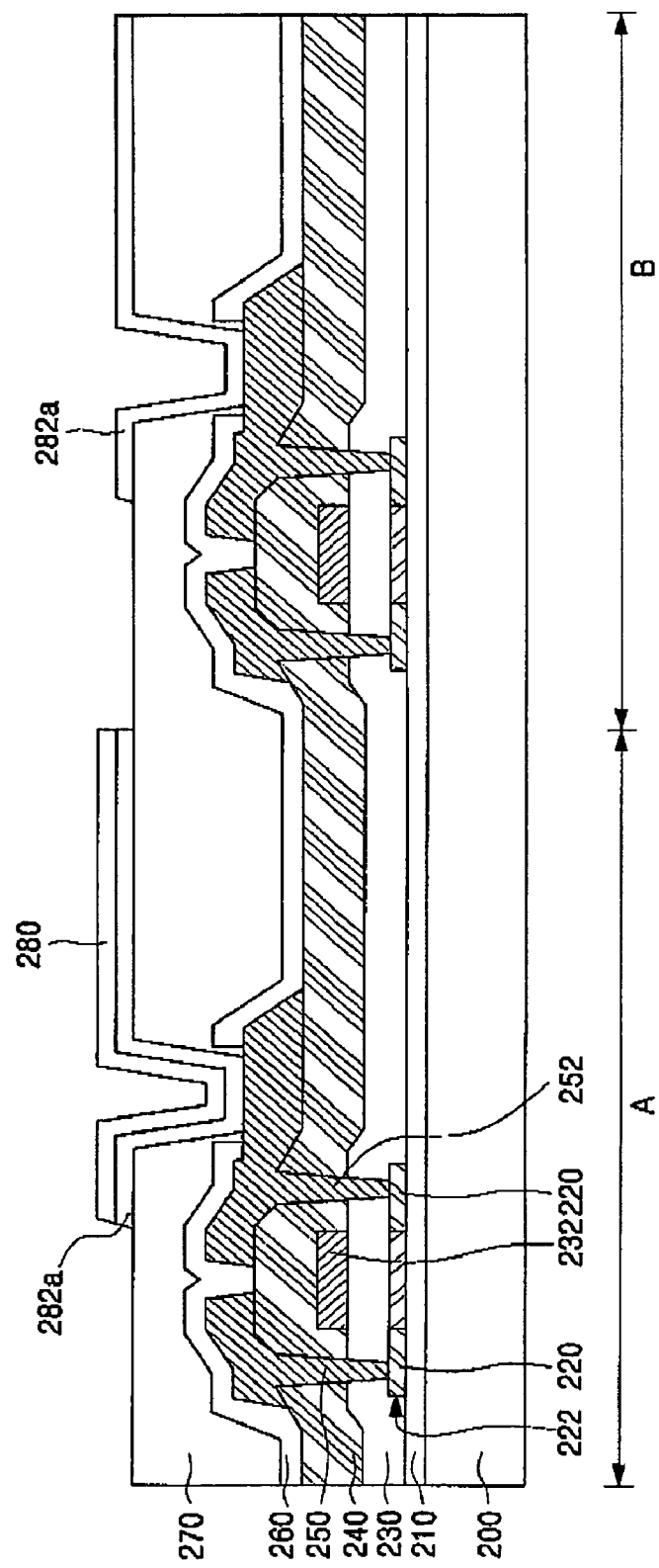
FIG. 2A and FIG. 2B are cross-sectional views showing a method of fabricating an OLED device according to an exemplary embodiment of the present invention.
Figure 2B:
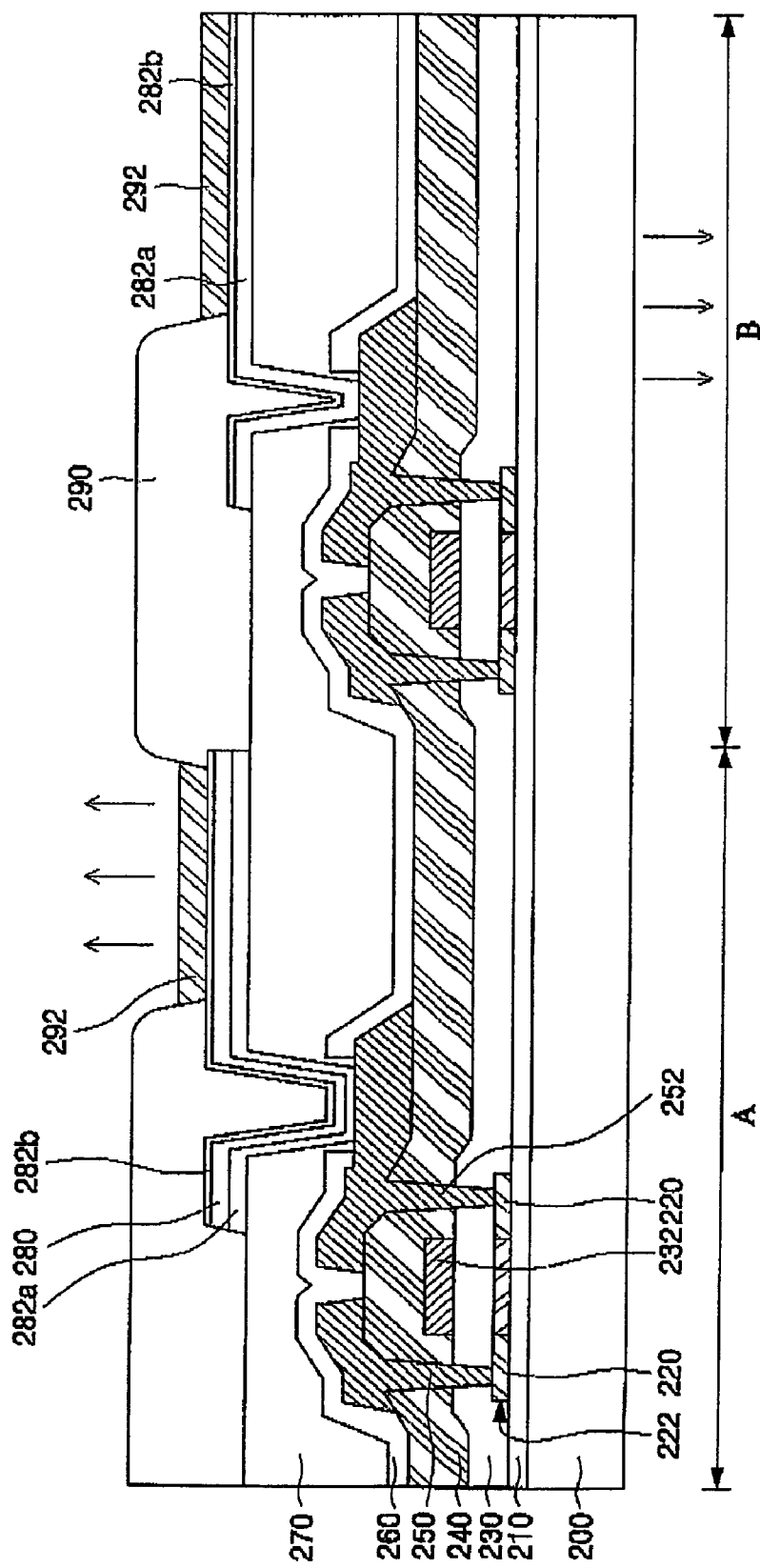

FIG. 2A and FIG. 2B are cross-sectional views showing an OLED device according to an exemplary embodiment of the present invention. Referring to FIG. 2A and FIG. 2B, a transparent insulating substrate 200 comprises a first region A and a second region B having differently structured anodes.

The anode in the first region A may have a stacked structure including a lower anode 282a, a reflective layer pattern 280 formed on the entire surface of the lower anode 282a, and an upper anode 282b formed on the reflective layer pattern 280. The lower anode 282a may be thicker than the upper anode 282b, and the reflective layer pattern 280 may be formed of silver (Ag) on the same region as the lower anode 282a and the upper anode 282b.

The anode in the second region B may have a stacked structure including the lower anode 282a and the upper anode 282b. The lower anode 282a may be formed to such a thickness that does not degrade optical properties even in increased resistance.

An OLED device according to an exemplary embodiment of the present invention may be formed by the following method.

The first region A and the second region B may be first defined on the transparent insulating substrate 200, which made be made of glass, quartz, sapphire, or other similar materials. All subsequent processes, except the process of forming the reflective layer in the first region A, may be simultaneously carried out in the first region A and the second region B.

Next, a buffer layer 210, which may be made of silicon oxide, may be formed to a predetermined thickness on the entire surface of the transparent insulating substrate 200 by a plasma-enhanced chemical vapor deposition (PECVD) method or other like method. The buffer layer 210 prevents diffusion of impurities in the transparent insulating substrate 200 when crystallizing a subsequently formed amorphous silicon layer.

The amorphous silicon layer (not shown) may then be deposited to a predetermined thickness on the buffer layer 210 and crystallized by excimer laser annealing (ELA), sequential lateral solidification (SLS), metal induced crystallization (MIC), metal induced lateral crystallization (MILC), or other similar methods. Thereafter, a polycrystalline silicon pattern 222 may be formed in the thin film transistor region within the unit pixel by patterning using photolithography and etching processes. The polycrystalline silicon pattern 222 also includes subsequently formed source and drain regions 220.

Next, a gate insulating layer 230 may be formed to a predetermined thickness on the entire surface of the substrate. The gate insulating layer 230 may be formed of silicon oxide, silicon nitride, a stacked structure thereof, or other like materials.

A metal layer (not shown), which forms a gate electrode, may be formed on the gate insulating layer 230. The metal layer may be a single layer of aluminum (Al) or an aluminum alloy such as aluminum-neodymium (AlNd), or it may be a multilayer in which the aluminum alloy is stacked on chromium (Cr) or molybdenum (Mo) alloy. The metal layer may then be etched by photolithography and etching processes to form a gate electrode 232. Thereafter, impurity ions may be injected into the polycrystalline silicon pattern 222 on both sides of the gate electrode 232, thereby forming the source and drain regions 220.

Next, an interlayer insulating layer 240 may be formed to a predetermined thickness on the entire surface of the substrate. A silicon nitride layer, or other like materials, may be used for the interlayer insulating layer 240.

The interlayer insulating layer 240 and the gate insulating layer 230 may then be etched by photolithography and etching processes, thereby forming a contact hole (not shown) exposing the source and drain regions 220. An electrode material may be formed on the entire surface of the substrate including the contact hole and etched by photolithography and etching processes, thereby forming source and drain electrodes 250 and 252, which are coupled to the source and drain regions 220. Molybdenum-tungsten (MoW), aluminum-neodymium (AlNd), a stacked structure thereof, or other like materials may be used for the electrode material.

Next, a passivation layer 260 may be formed to a predetermined thickness on the entire surface of the substrate by depositing a silicon nitride layer, a silicon oxide layer, a stacked structure thereof, or other like materials.

The passivation layer 260 may then be etched by photolithography and etching processes, thereby forming a first via contact hole (not shown) exposing either the source or drain electrode 250, 252. FIG. 2B shows the drain electrode 252 exposed.

A first insulating layer 270 may be formed on the entire surface of the substrate at a thickness that fully planarizes the thin film transistor region. The first insulating layer 270 may be formed of one material selected from the group consisting of polyimide, benzocyclobutene series resin, spin on glass (SOG), and acrylate.

Next, the first insulating layer 270 is etched by photolithography and etching processes, thereby forming a second via contact hole (not shown) exposing either the source or drain electrode 250, 252 exposed by the first via contact hole.

A thin layer for a lower anode (not shown) may then be formed on the entire surface of the substrate. The thin layer for the lower anode may be about a 100 to 1000 Å thick transparent metal electrode, such as ITO, IZO, $In_2O_3$, or $Sn_2O_3$. This thin layer may improve interfacial properties, namely, the adhesive properties between the reflective layer and the first insulating layer 270 in the first region, and may prevent resistance from increasing in the second region.

Next, the thin layer for the lower anode may be etched by photolithography and etching processes, thereby forming a lower anode 282a. The lower anode 282a may be coupled to either the source or drain electrode 250, 252. FIG. 2B shows the lower anode 282a coupled to the drain electrode 252 through the second via contact hole.

A reflective layer (not shown) may then be formed on the entire surface substrate. The reflective layer may be formed of silver (Ag), palladium (Pd) or platinum (Pt), or other like materials, having greater than 80% reflectivity. The reflective layer is preferably formed of silver (Ag), and it may be formed about 500 to 3000 Å thick.

Next, the reflective layer may be etched by photolithography and etching processes, thereby forming a reflective layer pattern 280 on a surface of the lower anode 282a in the first region A. The reflective layer pattern 280 may increase brightness and luminous efficiency by acting as a light reflector in the first region A. As FIG. 2A and FIG. 2B show, the reflective layer pattern 280 is not formed in the second region B.

A thin layer for an upper anode (not shown) may then be formed on the entire surface of the substrate. The thin layer for the upper anode may be about 10 to 300 Å thick. Preferably, it is about 20 to 100 Å thick, thus facilitating color-coordinate adjustment.

Next, the thin layer for the upper anode may be etched by photolithography and etching processes, thereby forming an upper anode 282b. The upper anode 282b may be formed on and at a side of the reflective layer pattern 280 in the first region A, and it may be formed on the lower anode 282a in the second region B. Hence, the anode in the first region A may comprise a triple layered structure of the lower anode 282a, the reflective layer pattern 280, and the upper anode 282b, while the anode in the second region B may comprise a double layered structure of the lower anode 282a and the upper anode 282b.

A second insulating layer (not shown) may then be formed on the entire surface of the substrate.

Next, a second insulating layer pattern 290, which defines an emission region, may be formed by etching the second insulating layer using photolithography and etching processes.

An emission layer 292 may then be formed in the emission region exposed by the second insulating layer pattern 290 by a small molecular deposition method, a laser thermal transfer method, or other like methods. The emission layer 292 may comprise at least one of an electron injecting layer, an electron transporting layer, a hole injecting layer, a hole transporting layer, a hole blocking layer, and an organic emission layer.

Although not shown, a cathode may then be formed to complete the OLED device. The cathode in the first region A may be a transparent electrode or transparent metal electrode, while the cathode in the second region B may be a transparent electrode having a reflective layer stacked thereon, or a reflective electrode. The cathode in the second region B may also be formed of a transparent electrode or a transparent metal electrode, like the cathode in the first region A.

Figure 3:
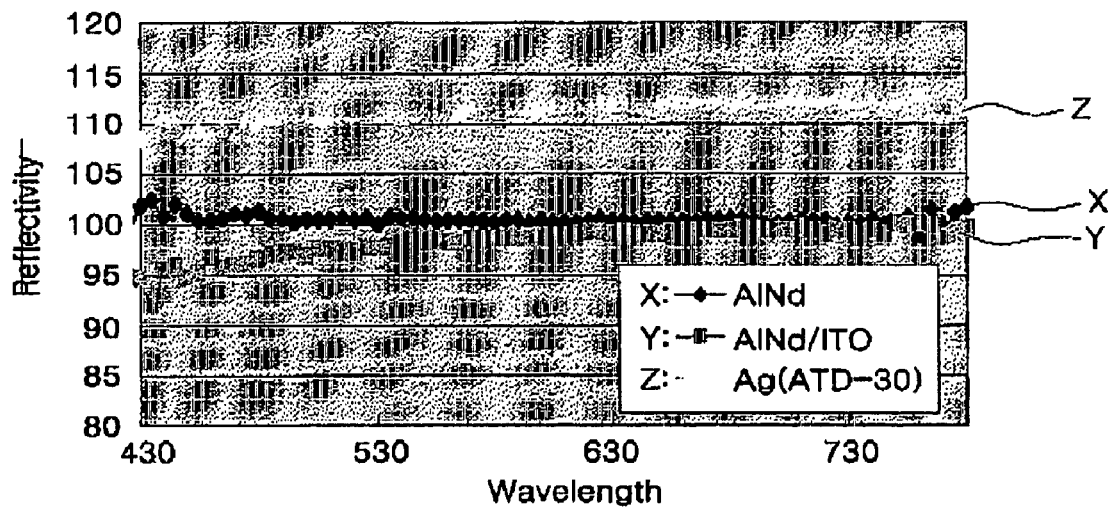
FIG. 3 is a graph showing reflectivity depending on the type of a reflective layer.

FIG. 3 is a graph showing reflectivity versus light wavelength depending on the type of a reflective layer. AlNd is used for the reflective layer in case (X), ITO is formed on the AlNd as the reflective layer in case (Y), and silver (Ag) is used for the reflective layer in case (Z). In case (Z), where the silver (Ag) is used for the reflective layer, a silver alloy ATD-30 (product name) was used for the silver (Ag). FIG. 3 shows that, irrespective of the wavelength of the light, the reflectivity in case (Z), where the silver (Ag) is used for the reflective layer, is about 15% higher than cases (X) and (Y), where AlNd and ITO formed on AlNd, are used as the reflective layer, respectively.

Figure 4:
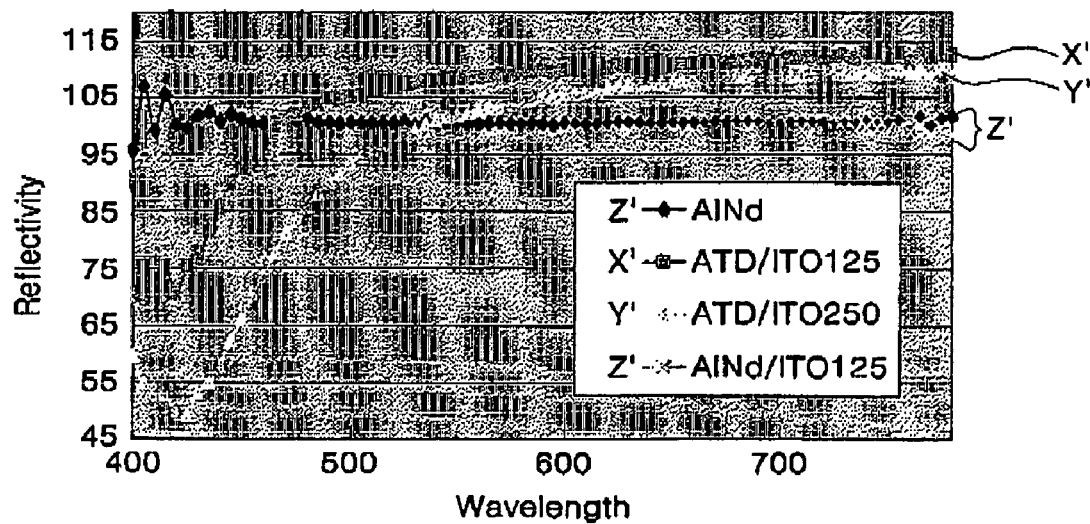
FIG. 4 is a graph showing reflectivity depending on the type of a reflective layer and anode thickness.

FIG. 4 is a graph showing a reflectivity versus light wavelength depending on the type of a reflective layer and the thickness of the anode layer formed on the reflective layer. Silver (Ag) is used for the reflective layer in cases (X' and Y'), and AlNd is used for the reflective layer in case Z'. The anode layer formed on the silver (Ag) reflective layer is about 125 Å thick in case (X') and about 250 Å thick in case (Y'). If the anode formed on the reflective layer is about 250 Å thick, reflectivity is dramatically degraded in a short wavelength region where the wavelength of the light is equal to or less than about 500. Therefore, when using silver (Ag) for the reflective layer, the thinner the anode formed on the reflective layer, the less the reflectivity changes depending on the wavelength of the light.

As described above, interposing a reflective layer pattern between two anode layers may improve reflectivity, prevent resistance in the junction region of the anodes from increasing, and prevent a short circuit from occurring between the anodes at a step portion, thereby improving the device's properties and reliability.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
a thin film transistor in a first region and a second region on a transparent substrate;
a lower anode coupled to either a source electrode or a drain electrode of the thin film transistor in the first region and the second region;
a reflective layer pattern formed on the lower anode in the first region;
an upper anode formed on the reflective layer pattern in the first region and the lower anode in the second region; and
an organic layer formed on the upper anode in the first region and the second region and having at least an emission layer,
wherein light emitted from the emission layer in the first region exits the light emitting display device in a direction away from the transparent substrate, and light emitted from the emission layer in the second region exits the light emitting display device through the transparent substrate or light emitted from the emission layer in the second region exits the light emitting display device through the transparent substrate and in a direction away from the transparent substrate.

2. The device of claim 1, further comprising:
an insulating layer,
wherein the lower anode is coupled to the source electrode or the drain electrode through a contact hole in the insulating layer; and
wherein the insulating layer comprises a stacked structure of a passivation layer and a planarization layer.

3. The device of claim 1, further comprising:
an insulating layer,
wherein the lower anode is coupled to the source electrode or the drain electrode through a contact hole in the insulating layer; and
wherein the insulating layer is a stacked structure of an inorganic insulating layer and an organic insulating layer.

4. The device of claim 1, wherein the lower anode is about 100 to 1000 Å thick.

5. The device of claim 1, wherein the reflective layer pattern is formed of one of silver, platinum, or palladium.

6. The device of claim 5, wherein the reflective layer pattern is formed of silver.

7. The device of claim 1, wherein the reflective layer pattern is about 500 to 3000 Å thick.

8. The device of claim 1, wherein the upper anode is about 10 to 300 Å thick.

9. The device of claim 8, wherein the upper anode is about 20 to 100 Å thick.

10. The device of claim 1, further comprising:
a cathode formed on the organic layer in the first region and the second region,
wherein the cathode in the first region is a transparent electrode; and
wherein the cathode in the second region is either a transparent electrode or a reflective electrode.

11. The device of claim 1, wherein the upper anode is formed directly on the lower anode in the second region.

12. The device of claim 11, wherein, in the first region, the reflective layer pattern is formed directly on the lower anode and the upper anode is formed directly on the reflective layer pattern.

13. The device of claim 12, wherein the reflective layer pattern is formed directly on the lower anode only.

14. The device of claim 12, wherein the lower anode is 100 to 1000 Å thick, and the upper anode is 10 to 300 Å thick.

15. The device of claim 14, wherein the reflective layer pattern is 500 to 3000 Å thick.

16. The device of claim 15, wherein the upper anode is 20 to 100 Å thick.

* * * * *